(12) United States Patent
Matsuda

(10) Patent No.: US 8,062,695 B2
(45) Date of Patent: Nov. 22, 2011

(54) METHOD FOR MANUFACTURING DISPLAY AND DISPLAY

(75) Inventor: Eisuke Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 330 days.

(21) Appl. No.: 11/842,511

(22) Filed: Aug. 21, 2007

(65) Prior Publication Data

US 2008/0048562 A1 Feb. 28, 2008

(30) Foreign Application Priority Data

Aug. 23, 2006 (JP) ................................ 2006-226003

(51) Int. Cl.
*B05D 5/06* (2006.01)
*C23C 14/28* (2006.01)

(52) U.S. Cl. .......... 427/66; 427/258; 427/271; 427/595; 427/596; 156/272.8

(58) Field of Classification Search ............ 427/66, 427/258, 271, 596, 595; 156/272.8
See application file for complete search history.

(56) References Cited

U.S. PATENT DOCUMENTS

| | | | |
|---|---|---|---|
| 2003/0045021 A1* | 3/2003 | Akai | 438/99 |
| 2005/0100661 A1* | 5/2005 | Lee et al. | 427/66 |
| 2005/0140286 A1* | 6/2005 | Ito et al. | 313/506 |
| 2005/0179374 A1* | 8/2005 | Kwak | 313/506 |
| 2006/0125390 A1* | 6/2006 | Oh | 313/506 |

FOREIGN PATENT DOCUMENTS

| | | |
|---|---|---|
| JP | 2003-059660 | 2/2003 |
| JP | 2005-011810 | 1/2005 |
| JP | 2005-031645 | 2/2005 |
| JP | 2005-165324 | 6/2005 |

* cited by examiner

*Primary Examiner* — James Lin
(74) *Attorney, Agent, or Firm* — SNR Denton US LLP

(57) ABSTRACT

Disclosed herein is a method for manufacturing a display, the method including the steps of: disposing a substrate over which a plurality of lower electrodes and a plurality of auxiliary electrodes are formed and a donor film over which a light-emitting functional layer is formed so that the light-emitting functional layer contacts with the lower electrodes and does not contact with the auxiliary electrodes; irradiating the donor film with an energy beam to selectively transfer the light-emitting functional layer onto the lower electrodes; and forming an upper electrode that covers the light-emitting functional layer and the auxiliary electrodes.

7 Claims, 14 Drawing Sheets

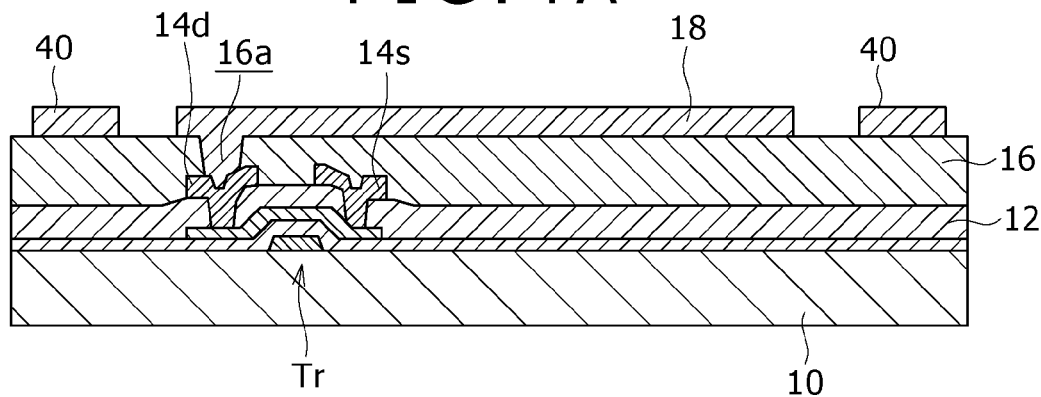
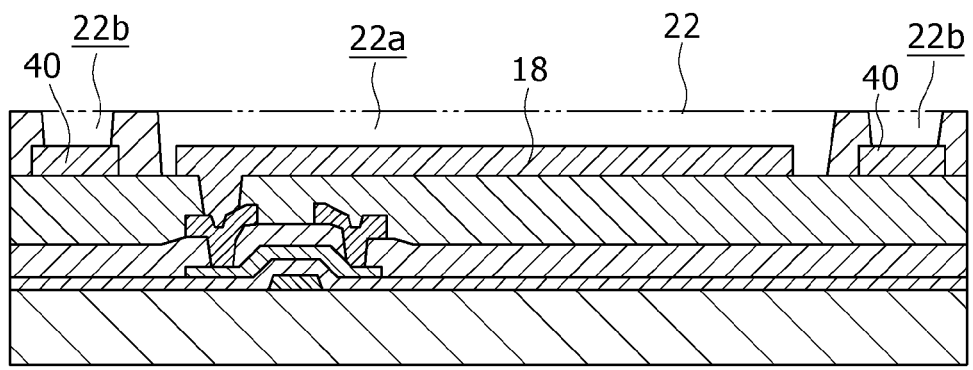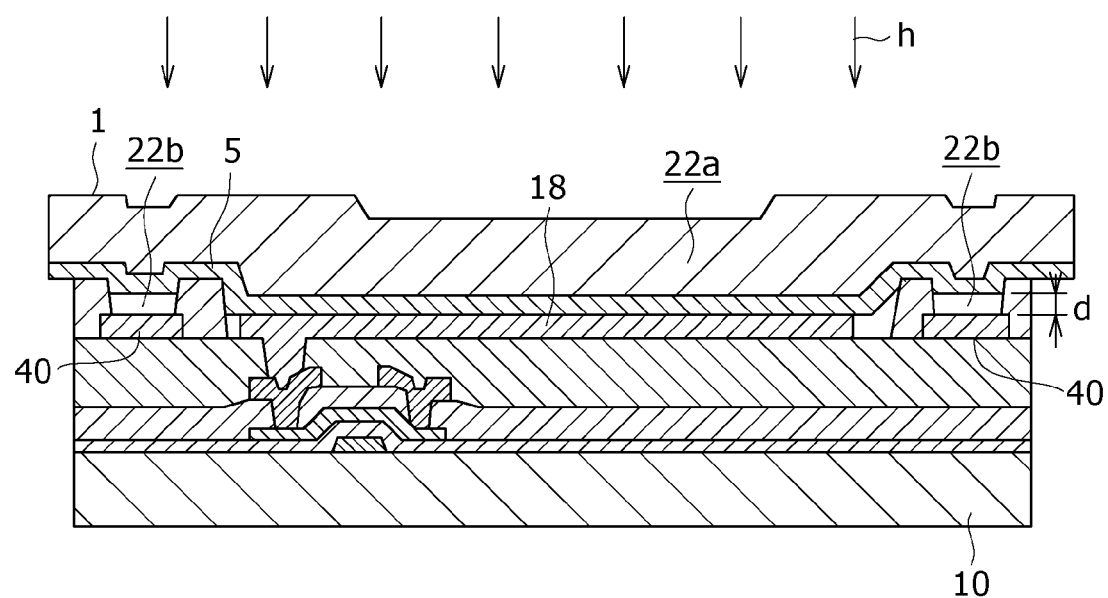

METHOD FOR MANUFACTURING DISPLAY AND DISPLAY

CROSS REFERENCES TO RELATED APPLICATIONS

The present invention contains subject matter related to Japanese Patent Application JP 2006-226003 filed in the Japan Patent Office on Aug. 23, 2006, the entire contents of which being incorporated herein by reference.

BACKGROUND OF THE INVENTION

1. Field of the Invention

The present invention relates to a method for manufacturing a display that has organic electro-luminescence elements each including an organic light-emitting layer, and a display.

2. Description of the Related Art

An organic electro-luminescence element, which employs electro-luminescence (hereinafter, represented as EL) of an organic material, is a light-emitting element that includes a light-emitting layer composed of an organic material and so on between a lower electrode and an upper electrode and can emit light with high luminance through low-voltage DC driving.

In recent years, attention is being paid on a transfer method as a technique for forming organic layer patterns in manufacturing of a full-color display employing the organic EL elements. In particular, a contact transfer method allows an organic layer to be transferred to a transfer-destination substrate in the state in which the multilayer structure of the organic layer formed over a donor film as the transfer origin is kept as it is. Therefore, this method permits simplification of steps for manufacturing a display.

In the contact transfer method, initially a donor film over which an organic layer is deposited in advance is brought into close contact with a substrate over which a lower electrode is patterned in advance. Subsequently, only the area corresponding to the part over which the organic layer should be formed is irradiated with laser light. This causes only the organic layer part irradiated with the laser light to be selectively transferred from the donor film onto the lower electrode over the substrate.

A structure for the contact transfer method has been proposed to prevent troubles of the transfer due to insufficiency of the close contact between a donor film and a substrate even when recesses and projections exist on the surface of the substrate over which an organic layer is to be transferred. Specifically, in this structure, the taper angles of the recesses and projections are set to 40° or smaller, and the heights of the steps of the recesses and projections are set to 3000 Å or smaller to prevent the troubles (refer to Japanese Patent Laid-Open No. 2005-165324 (Paragraphs 0013 and 0016, in particular)).

SUMMARY OF THE INVENTION

As the system for driving a display employing organic EL elements, a simple-matrix system and an active-matrix system are available. When the number of pixels is large, the active-matrix system is more suitable.

It is preferable that an active-matrix display have a so-called top-face light extraction structure (hereinafter, referred to as a top-emission structure) for extracting light from the opposite side of a substrate in order to assure a high aperture ratio of organic EL elements. In a top-emission display, the upper electrode is formed of a transparent or semi-transparent material. However, the upper electrode composed of a transparent or semi-transparent material has high resistance. Therefore, a voltage gradient is generated in the upper electrode and thus a voltage drop arises therein, which significantly deteriorates the displaying performance. To address this, a structure has been proposed in which an auxiliary electrode for the upper electrode is provided among the respective pixels to prevent the voltage drop.

However, when the above-described contact transfer method is applied to manufacturing of a display in which an auxiliary electrode is provided, if an error of the laser light irradiation position occurs, an organic layer will be transferred also onto the auxiliary electrode, which will cause contact failure between the upper electrode and the auxiliary electrode. This precludes the effective prevention of the voltage drop, and thus makes it difficult to enhance the displaying performance.

As a countermeasure to prevent this problem, a method would be available in which the lower electrode and the auxiliary electrode are disposed at positions that are sufficiently far away from each other so that the laser light irradiation area will not overlap with the auxiliary electrode. However, this method imposes severe limitations on the pixel layout, and leads to a low aperture ratio.

There is a need for the present invention to provide a method in which in formation of an organic layer on a lower electrode by a contact transfer method, formation of the organic layer on an auxiliary electrode can be prevented without the lowering of the pixel aperture ratio.

In a method for manufacturing a display according to an embodiment of the present invention, the following steps are sequentially carried out. Initially, a substrate over which a plurality of lower electrodes and a plurality of auxiliary electrodes are formed and a donor film over which a light-emitting functional layer is formed are prepared. Subsequently, the substrate and the donor film are disposed so that the light-emitting functional layer contacts with the lower electrodes and does not contact with the auxiliary electrodes. In this state, the donor film is irradiated with an energy beam, and thereby the light-emitting functional layer is selectively transferred onto the lower electrodes. Thereafter, an upper electrode is formed to form light-emitting elements. The light-emitting functional layer is interposed between the upper and lower electrodes, and the upper electrode is connected to the auxiliary electrodes.

In such a manufacturing method, even when a positional error of the area irradiated with the energy beam occurs, the light-emitting functional layer is not transferred on the auxiliary electrode because a gap is provide between the auxiliary electrode at the bottom of the connection hole and the donor film.

BRIEF DESCRIPTION OF THE DRAWINGS

FIGS. 4A to 4F are sectional views showing steps of a manufacturing method according to a second embodiment of the present invention;

DETAILED DESCRIPTION OF THE PREFERRED EMBODIMENTS

Embodiments of the present invention will be described in detail below based on the drawings.

<Donor Film>

Figure 1:
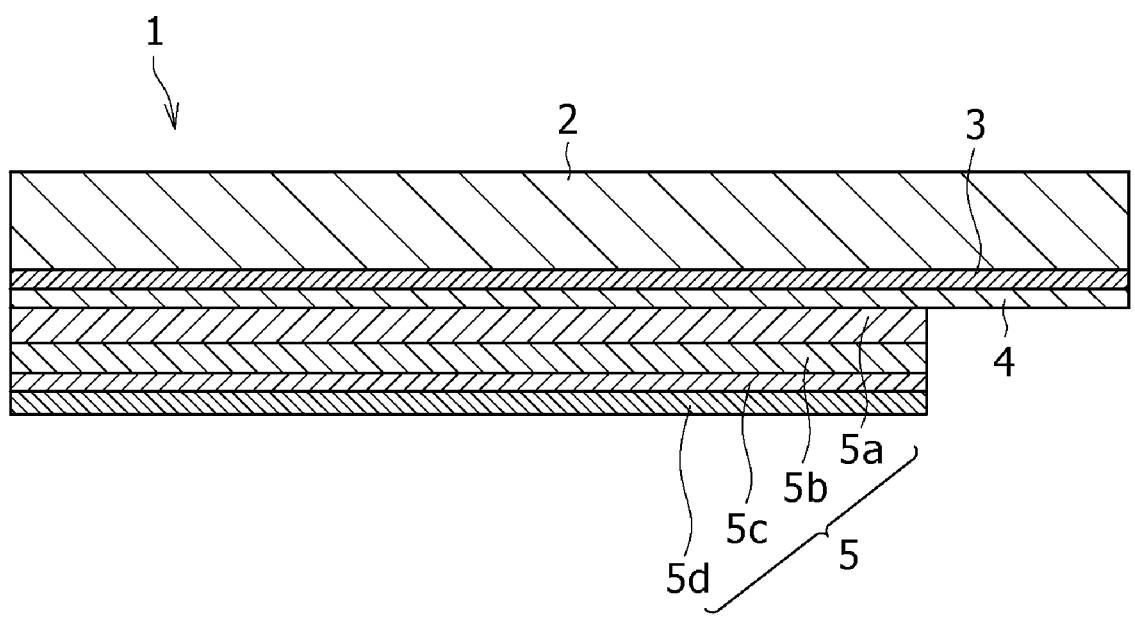
FIG. 1 is a sectional view showing major part of one configuration example of a donor film used in a manufacturing method according to an embodiment of the present invention.

A donor film 1 shown in FIG. 1 is used for formation of an organic layer of organic EL elements in manufacturing of a display that employs the organic EL elements as its light-emitting elements. In this donor film 1, an organic layer (i.e., light-emitting functional layer) 5 as a transfer target is provided over a base film 2 with a photothermal conversion layer 3 and a protective layer 4.

1) Base Film 2

As the base film 2, a transparent polymer film can be used. Examples of the transparent polymer include, but not limited to, polycarbonate, polyethylene terephthalate, polyester, polyacryl, polyepoxy, polyethylene, polystyrene, and polyethersulfone. It is preferable that the film thickness of the base film 2 is about 10 to 600 μm, and a thickness of about 50 to 200 μm is more preferable.

2) Photothermal Conversion Layer 3

The photothermal conversion layer 3 is a film that has a function to absorb light and generate heat efficiently. Examples of such a film include, but not limited to, an aluminum film, metal film composed of an oxide/nitride of aluminum, and film obtained by dispersing carbon black, graphite, infrared dye, or the like in a polymer material.

3) Protective Layer 4

The protective layer 4 is disposed between the photothermal conversion layer 3 and the organic layer 5, which is a transfer layer, and prevents contamination from the photothermal conversion layer 3 to the organic layer 5. Examples of the material of the protective layer 4 include, but not limited to, poly-α-methylstyrene. It is also possible for the protective layer 4 to have also a function to assist separation of the organic layer 5 and a function to control the heat generated by the photothermal conversion layer 3.

The provision of the protective layer 4 depends on need.

Although not shown in the drawing, a gas generation layer may be provided on the protective layer 4 according to need. The gas generation layer is to absorb light or heat to generate and discharge a gas (e.g., nitrogen gas) through decomposition reaction for efficient transfer. Examples of the material thereof include pentaerythritol tetranitrate and trinitrotoluene. However, the present invention is not particularly limited thereto.

4) Organic Layer 5

The organic layer 5 may have a single-layer structure or alternatively may have a multi-layer structure. It is important for the organic layer 5 to have a layer structure designed depending on the characteristics necessary for organic EL elements to be manufactured by using the donor film. Examples of the structure of the organic layer 5 include the following single-layer structures and multi-layer structures.

(1) organic light-emitting layer
(2) electron transport layer
(3) hole transport layer/organic light-emitting layer
(4) organic light-emitting layer/electron transport layer
(5) hole transport layer/organic light-emitting layer/electron transport layer
(6) hole injection layer/hole transport layer/organic light-emitting layer/electron transport layer
(7) hole injection layer/hole transport layer/organic light-emitting layer/blocking layer/electron transport layer Each of the layers in these structures (1) to (7) may be a single layer or alternatively may have a multi-layer structure. In some cases, the multi-layer structures (3) to (7) possibly have the reverse layer-stacking order depending on the configuration of organic EL elements. Each layer in the structures (1) to (7) can be deposited by an existing method. For example, an organic light-emitting layer can be formed through direct deposition of an organic light-emitting material by a dry process such as vacuum evaporation, EB, MBE, or sputtering. However, the present invention is not particularly limited thereto.

FIG. 1 shows, as one example, the organic layer 5 that has the structure obtained by reversing the structure (6). Specifically, the organic layer 5 has a structure in which an electron transport layer 5a, an organic light-emitting layer 5b, a hole transport layer 5c, and a hole injection layer 5d are deposited in that order from the base film side.

In the case of manufacturing of a full-color display, in order to form organic EL elements of light-emission colors of red, green and blue over a substrate, three kinds of donor films 1 corresponding to these light-emission colors are prepared. In these donor films 1, at least the organic light-emitting layers 5b have different configurations each formed by using a light-emitting material specific to a respective one of the light-emission colors.

As one specific example, in the donor film 1 used for formation of blue organic EL elements, Alq3 [tris(8-quinolinolato)aluminum(III)] is evaporated to a film thickness of 20 nm as the electron transport layer 5a that serves also as a light-emitting layer. On the electron transport layer 5a, a material layer is deposited by evaporation as the organic light-emitting layer 5b. For example, this material layer has a film thickness of about 25 nm and arises from doping of ADN (anthracene dinaphtyl), which is an electron transport host material, with 2.5-wt. % 4,4'-bis[2-{4-(N, N-diphenylamino)phenyl}vinyl]biphenyl (DPAVBi), which is a blue-light-emitting guest material. Subsequently, as the hole transport layer 5c, α-NPD [4,4-bis(N-1-naphthyl-N-phenylamino)biphenyl] is evaporated to a film thickness of 30 nm. At last, as the hole injection layer 5d, m-MTDATA [4,4,4-tris(3-methylphenylphenylamino)triphenylamine] is evaporated to a film thickness of 10 nm.

First Embodiment

FIGS. 2A to 2F are sectional views for explaining steps of a manufacturing method that employs a donor film having the above-described one configuration example according to a first embodiment of the present invention. These sectional views of steps correspond to a section of one pixel in the display area.

Figure 2A:
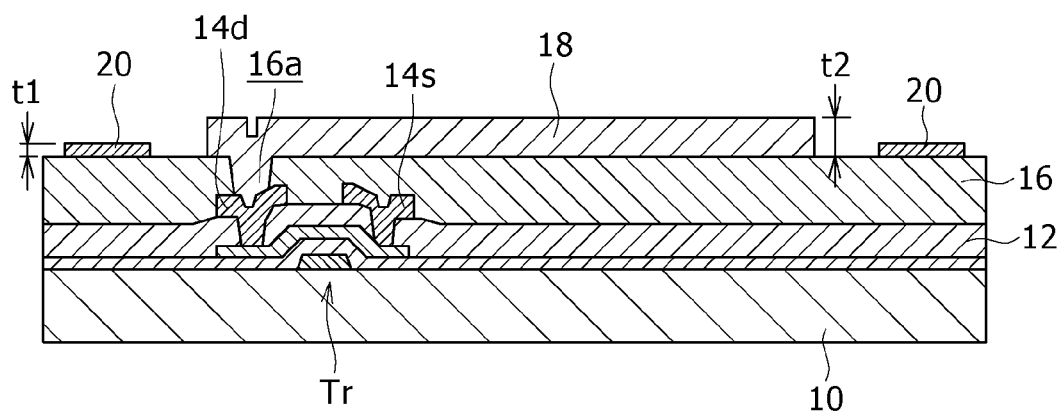
FIGS. 2A to 2F are sectional views showing steps of a manufacturing method according to a first embodiment of the present invention.

Referring initially to FIG. 2A, a thin film transistor Tr, capacitive element, and resistive element (not shown)

included in a pixel circuit are formed on a substrate 10 composed of e.g. an optically transparent material. Subsequently, a first insulating film 12 that covers these elements (thin film transistor Tr, in the drawing) is deposited. Furthermore, on the first insulating film 12, a source electrode interconnect 14s and a drain electrode interconnect 14d that are connected to the transistor Tr, and a signal line, power supply line, and so on that are connected to these interconnects 14s and 14d are adequately formed.

Thereafter, a second insulating film 16 is formed on the first insulating film 12 in such a manner as to cover these interconnects. In the present example, this second insulating film 16 is formed as a planarization insulating film composed of e.g. an organic insulating material such as polyimide or photoresist or an inorganic insulating material such as SOG. In this second insulating film 16, a connection hole 16a reaching the drain electrode interconnect 14d is formed.

Figure 3:
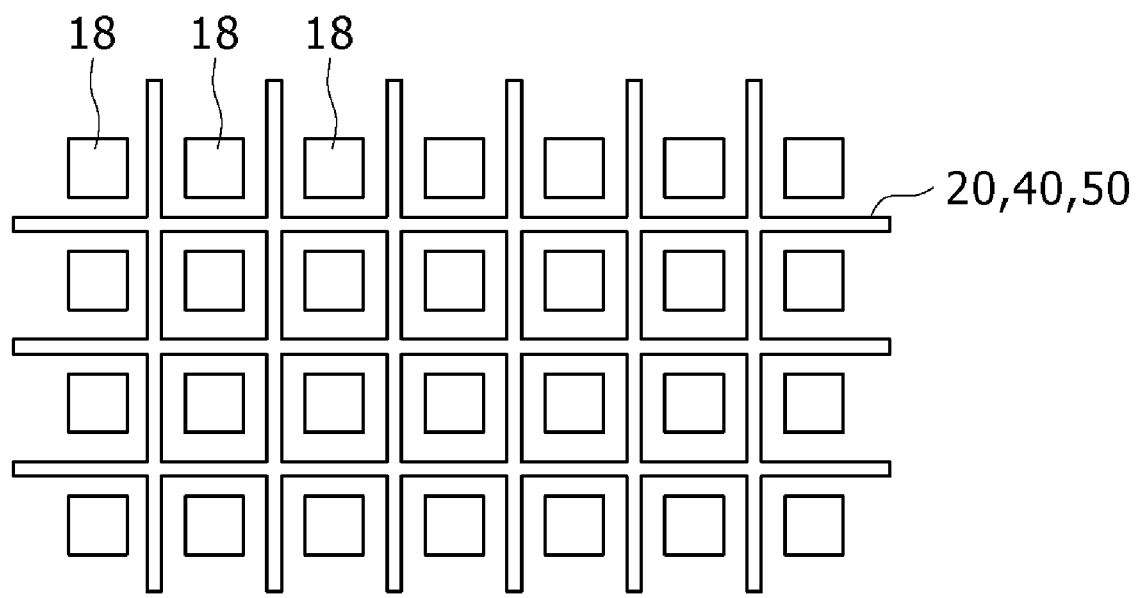
FIG. 3 is a plan view showing one example of the layout of lower electrodes and an auxiliary electrode in an embodiment of the present invention.

Subsequently, a lower electrode 18 of an organic EL element is formed on the planarization surface of the second insulating film 16 formed as a planarization insulating film. As shown in the layout diagram of FIG. 3 for example, the lower electrodes 18 are formed into a matrix in the display area as pixel electrodes each used for a respective one of pixels, and each of the lower electrodes 18 is connected through the connection hole 16a to the drain electrode interconnect 14d.

The lower electrode 18 is used as an anode electrode in the present example. If the display to be manufacturing in the present example is a top-emission display, the lower electrode 18 is formed by using a material that is highly reflective for visible light. In contrast, if the display is a transmissive one, the lower electrode 18 is formed by using a material that is transparent to visible light.

When the display is a top-emission one, the lower electrode 18 serving as an anode electrode is formed by using any of the following conductive materials having high reflectivity for visible light or an alloy of any of the materials: silver (Ag), aluminum (Al), chromium (Cr), iron (Fe), cobalt (Co), nickel (Ni), copper (Cu), tantalum (Ta), tungsten (W), platinum (Pt), and gold (Au).

When the display is a transmissive one and the lower electrode 18 is used as an anode electrode, the lower electrode 18 is formed by using a conductive material offering high transmittance for visible light, such as indium tin oxide (ITO) or indium zinc oxide (IZO).

When an organic EL element is a top-emission element and the lower electrode 18 is used as a cathode electrode, the lower electrode 18 is formed by using a material having high reflectivity for visible light, of conductive materials having a small work function, such as aluminum (Al), indium (In), and magnesium (Mg)-silver (Ag) alloy. When an organic EL element is a transmissive one and the lower electrode 18 is used as a cathode electrode, the lower electrode 18 is formed by using a conductive material that has a small work function and offers high transmittance for visible light.

On the second insulating film (planarization insulating film) 16, an auxiliary electrode 20 is formed in such a manner as to be kept isolated from the lower electrode 18. This auxiliary electrode 20 may be supplied with a common potential in the display area. As shown in the layout diagram of FIG. 3 for example, the auxiliary electrode 20 is provided on rows and columns among the lower electrodes 18 arranged in a matrix.

In the first embodiment in particular, it is important that the film thickness of the auxiliary electrode 20 be set smaller than that of the lower electrode 18. It is preferable that the relationship $t_2 \geq t_1 +$ about 500 nm be satisfied when $t_1$ and $t_2$ denote the film thicknesses of the auxiliary electrode 20 and the lower electrode 18, respectively. This relationship allows the surface of the lower electrode 18 to be positioned higher than that of the auxiliary electrode 20.

The auxiliary electrode 20 may be formed in a step different from the step for forming the lower electrode 18 separately. Alternatively, it may be formed in the same step, and then the film thickness thereof may be adjusted through etching for decreasing only the thickness of the auxiliary electrode 20.

Figure 2B:
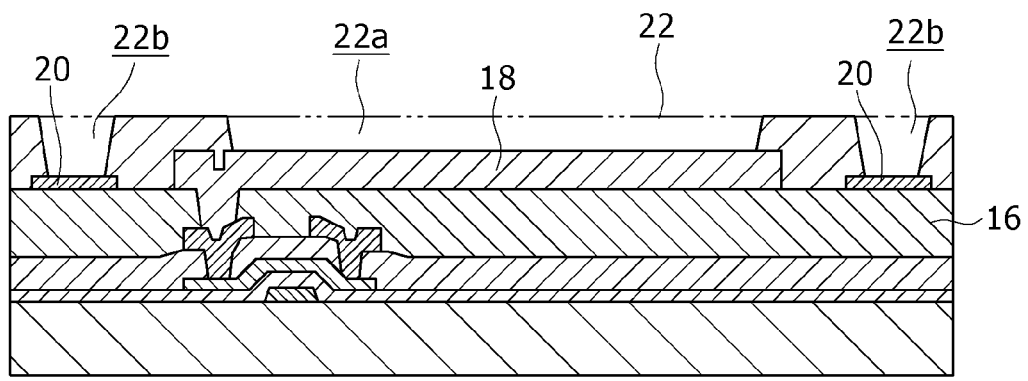

Referring next to FIG. 2B, a third insulating film 22 is formed in such a manner as to cover the lower electrode 18 and the auxiliary electrode 20. The third insulating film 22 is formed as a planarization insulating film composed of e.g. an organic insulating material such as polyimide or photoresist or an inorganic insulating material such as SOG. Thus, the thickness of the third insulating film 22 on the auxiliary electrode 20 is larger than that on the lower electrode 18.

Subsequently, in the third insulating film 22, a opening 22a that widely exposes the center part of the lower electrode 18 with the peripheral edge thereof covered, and a connection hole 22b reaching the auxiliary electrode 20 are formed. Thus, the depth of the connection hole 22b on the auxiliary electrode 20 is larger than that of the opening 22a on the lower electrode 18. In this aperture formation step, it is preferable to carry out etching of which condition is so set that the taper angle of the sidewall of the opening 22a will be set to 30° or smaller.

Figure 2C:
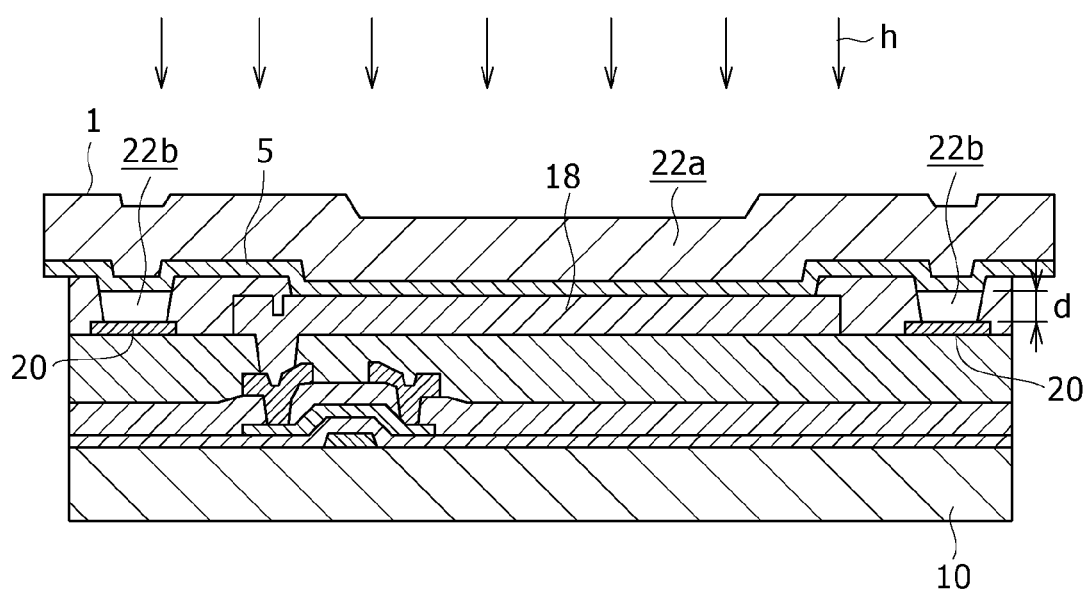

Referring next to FIG. 2C, a donor film 1 is disposed on one surface side of the substrate 10 on which the lower electrode 18 is formed. Specifically, the organic layer side of the donor film 1 with the configuration described with FIG. 1 is brought into close contact with the lower electrode side of the substrate 10. At this time, a gap d is provided between the organic layer 5 and the auxiliary electrode 20 exposed at the bottom of the connection hole 22b, which is deeper than the opening 22a. On the other hand, the organic layer 5 is brought into close contact with the lower electrode 18 exposed at the bottom of the opening 22a, which is shallower than the connection hole 22b.

In this state, from the donor film side, the part corresponding to the lower electrodes 18 of selected pixels is irradiated with an energy beam such as laser light h. For example, in the state in which the donor film 1 for red organic EL elements is brought into close contact with the substrate 10, only the area corresponding to the lower electrodes 18 formed in red pixels is selectively irradiated with the laser light h. Thereby, the organic layer 5 over the donor film 1 is selectively transferred onto the lower electrodes 18.

Used as the laser light h is light having a wavelength that permits the material of the photothermal conversion layer (see FIG. 1) of the donor film 1 to efficiently absorb the light. For example, when the photothermal conversion layer is formed of a polymer layer containing carbon black, e.g. a semiconductor CW laser source is used to emit infrared laser light having a wavelength of 800 nm, so that the photothermal conversion layer (see FIG. 1) of the donor film 1 is caused to absorb the laser light h and heat generated therein is used to transfer the organic layer 5 deposited over the donor film 1 onto the substrate 10.

In the contact transfer, it is important that the area to be irradiated with the laser light h is so designed that the laser light h will be emitted to a sufficient area corresponding to the whole of the lower electrode 18 exposed via the opening 22a and thereby the exposed face of the lower electrode 18 in a selected pixel will be completely covered by the organic layer 5. Therefore, when a laser emission apparatus includes an accurate alignment mechanism, the laser light h having a properly adjusted spot diameter is emitted along alignment marks (e.g., lower electrodes 18) over the substrate 10.

Furthermore, it is also possible to use a mask having apertures corresponding to the part to be irradiated with the laser light h. In this case, the mask (not shown) is disposed over the donor film 1, and the laser light h having a spot diameter larger than the diameter of the aperture is emitted. This allows the laser light h to be accurately emitted onto the requisite area via the mask apertures.

In the case of using a mask, a wide area (e.g., the entire face) may be collectively irradiated with laser light. This permits an intended place to be irradiated with the laser light h in a short time.

Figure 2D:
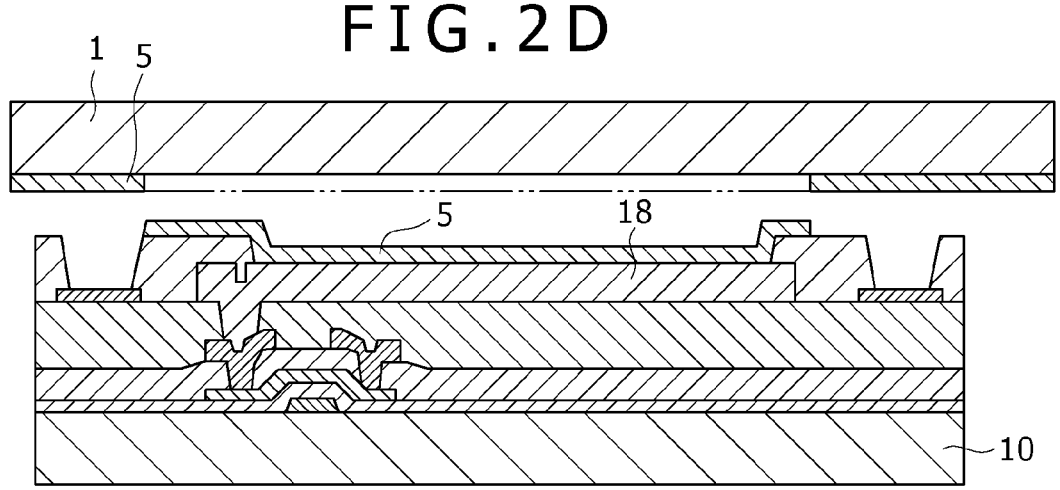

Referring next to FIG. 2D, the donor film 1 is separated from the substrate 10. On the lower electrodes 18 of the red pixels, the organic layer 5 is formed.

Thereafter, by using the donor film 1 for green organic EL elements, the steps of FIGS. 2C and 2D are carried out to selectively form the organic layer 5 for green light emission on the lower electrodes 18 formed in green pixels. In addition, by using the donor film 1 for blue organic EL elements, the steps of FIGS. 2C and 2D are carried out to selectively form the organic layer 5 for blue light emission on the lower electrodes 18 formed in blue pixels.

Figure 2E:
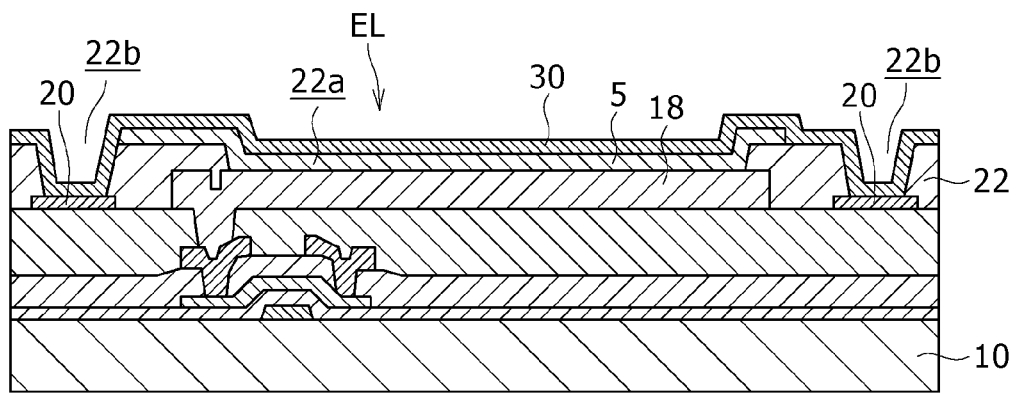

Subsequently, as shown in FIG. 2E, an upper electrode 30 common to the respective pixels is formed on the whole of the display area over the substrate 10. The upper electrode 30 is connected to the auxiliary electrode 20. The upper electrode 30 is isolated from the lower electrode 18 by the organic layer 5 and the third insulating film 22.

In the present example, the upper electrode 30 is formed as a cathode electrode because the lower electrode 18 is formed as an anode electrode. When the display to be manufactured is a top-emission one, the upper electrode 30 is formed by using a material that is transparent or semi-transparent to visible light. When the display is a transmissive one, the upper electrode 30 is formed by using a material having high reflectivity for visible light.

When the display is a top-emission one, it is preferable that the upper electrode 30 serving as a cathode electrode be formed of a material having a small work function so that electrons can be efficiently injected into the organic layer 5. Furthermore, to promote the electron injection, the upper electrode 30 may have a multi-layer structure including an inorganic thin film such as a LiF film. In the present example, a metal thin film that offers high transmittance, preferably transmittance of 30% or higher, is used as the upper electrode 30. For example, an Mg—Ag alloy film is formed by co-sputtering to a film thickness of 14 nm.

When the display is a transmissive one, the upper electrode 30 to serve as a cathode electrode is formed by using a conductive material that has a small work function and high reflectivity for visible light.

The formation of the upper electrode 30 is carried out by using a deposition method in which the energy of deposition particles is so low that no influence is given to the underlying layers, such as evaporation or chemical vapor deposition (CVD). Furthermore, it is preferable that the formation of the upper electrode 30 be carried out in the same apparatus as that for the formation of the organic layer 5 successively to the formation of the organic layer 5 without exposure of the organic layer 5 to the atmosphere, to prevent the deterioration of the organic layer 5 due to water in the atmosphere.

Through the above-described steps, the organic electro-luminescence elements EL in which the organic layer 5 is interposed between the lower electrode 18 and the upper electrode 30 are formed over the substrate 10, corresponding to the respective openings 22a. For the organic electro-luminescence elements EL, the upper electrode 30 is connected to the auxiliary electrode 20, which prevents a voltage drop.

Figure 2F:
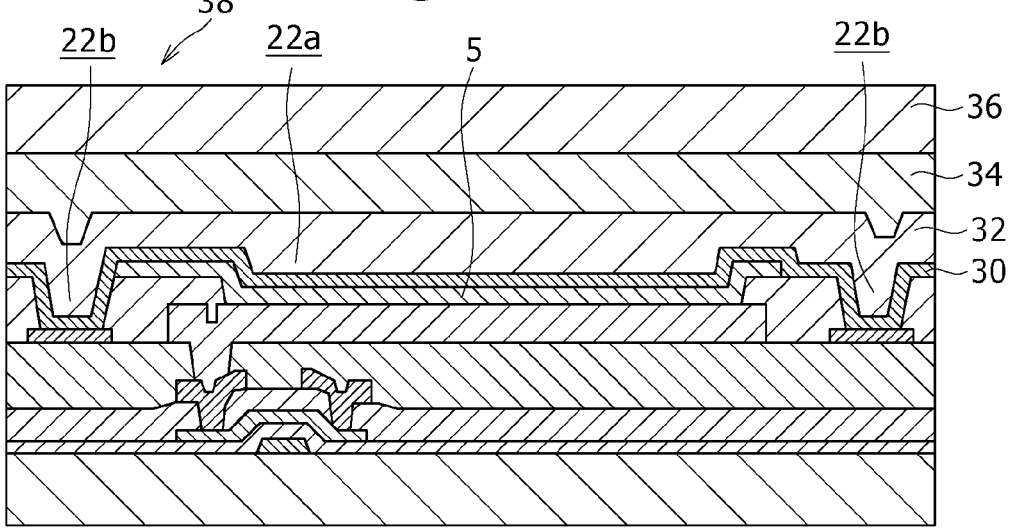

Referring next to FIG. 2F, an insulating or conductive protective film 32 is provided on the upper electrode 30. Used for the provision of the protective film 32 is a deposition method in which the energy of deposition particles is so low that no influence is given to the underlying layers, such as evaporation or chemical vapor deposition (CVD). Furthermore, the formation of the protective film 32 is carried out in the same apparatus as that for the formation of the upper electrode 30 successively without exposure of the upper electrode 30 to the atmosphere. This prevents the deterioration of the organic layer 5 due to water and oxygen in the atmosphere.

The protective film 32 is formed to a sufficiently large film thickness by using a material with low water permeability and low water absorption in order to prevent water from reaching the organic layer 5. Moreover, when the display is a top-emission one, this protective film 32 is formed by using a material that allows the passage of light generated by the organic layer 5.

In the present example, the protective film 32 is formed by using an insulating material. For such a protective film 32, an inorganic amorphous insulating material such as amorphous silicon ($\alpha$-Si), amorphous silicon carbide ($\alpha$-SiC), amorphous silicon nitride ($\alpha$-Si1-xNx), or amorphous carbon ($\alpha$-C) can be preferably used. Such an inorganic amorphous insulating material includes no grain and thus has low water permeability.

For example, in the case of forming the protective film 32 composed of an amorphous silicon nitride, it is formed by CVD to a film thickness of 2 to 3 μm. In this film deposition, it is desirable that the deposition temperature be set to a room temperature in order to prevent luminance lowering due to the deterioration of the organic layer 5 and the deposition condition be so set that the film stress can be minimized in order to prevent separation of the protective film 32.

In the case of forming the protective film 32 by using a conductive material, a transparent conductive material such as ITO or IZO is used.

After the formation of the protective film 32, a counter substrate 36 is fixed over the protective film 32 with a UV-curable resin 34 according to need, so that a display 38 is completed.

Second Embodiment

FIGS. 4A to 4F are sectional views for explaining steps of a manufacturing method that employs a donor film having the above-described one configuration example according to a second embodiment of the present invention. These sectional views of steps correspond to a section of one pixel in the display area. The same components in the second embodiment as those in the first embodiment are given the same numerals, and a redundant description thereof is omitted.

Referring initially to FIG. 4A, elements such as a thin film transistor Tr included in a pixel circuit are formed on a substrate 10, and these elements are covered by a first insulating film 12. On the first insulating film 12, a source electrode interconnect 14s and a drain electrode interconnect 14d that are connected to the thin film transistor Tr, and a signal line, power supply line, and so on that are connected to these interconnects 14s and 14d are adequately formed.

Subsequently, a second insulating film 16 is formed on the first insulating film 12 in such a manner as to cover these interconnects. It is preferable that this second insulating film 16 be formed as a planarization insulating film. In this second insulating film 16, a connection hole 16a reaching the drain electrode interconnect 14d is formed.

Subsequently, a lower electrode 18 of an organic EL element and an auxiliary electrode 40 are formed on the planarization surface of the second insulating film 16 formed as a planarization insulating film. As shown in the layout diagram of FIG. 3, the lower electrodes 18 are formed into a matrix in the display area as pixel electrodes each used for a respective one of pixels, and each of the lower electrodes 18 is connected via the connection hole 16a to the drain electrode interconnect 14d. The auxiliary electrode 40 may be supplied with a common potential in the display area, and is provided on rows and columns among the lower electrodes 18 arranged in a matrix. The lower electrode 18 and the auxiliary electrode 40 may be formed in the same step.

Referring next to FIG. 4B, a third insulating film 22 is formed in such a manner as to cover the lower electrode 18 and the auxiliary electrode 40. The third insulating film 22 is formed as a planarization insulating film composed of e.g. an organic insulating material such as polyimide or photoresist or an inorganic insulating material such as SOG.

Subsequently, in the third insulating film 22, a opening 22a that exposes the lower electrode 18, and a connection hole 22b reaching the auxiliary electrode 40 are formed. A feature of the second embodiment is that the size of the opening 22a is so increased that the sidewall of the lower electrode 18 is also exposed to reduce the ratio of the aperture size of the connection hole 22b to that of the opening 22a.

After the above-described steps, the steps shown in FIGS. 4C to 4F are carried out similarly to the first embodiment.

Referring initially to FIG. 4C, a donor film 1 is disposed on one surface side of the substrate 10 on which the lower electrode 18 is formed. Specifically, the organic layer side of the donor film 1 with the configuration described with FIG. 1 is brought into close contact with the lower electrode side of the substrate 10. At this time, the organic layer 5 is brought into close contact with the lower electrode 18 exposed at the bottom of the opening 22a having the increased size. On the other hand, a gap d is provided between the organic layer 5 and the auxiliary electrode 40 exposed at the bottom of the connection hole 22b, of which aperture size ratio is sufficiently decreased with respect to the increased size of the opening 22a.

In this state, from the donor film side, the part corresponding to the lower electrodes 18 of selected pixels is irradiated with an energy beam such as laser light h. Thereby, the organic layer 5 over the donor film 1 is selectively transferred onto the lower electrodes 18.

Figure 4D:
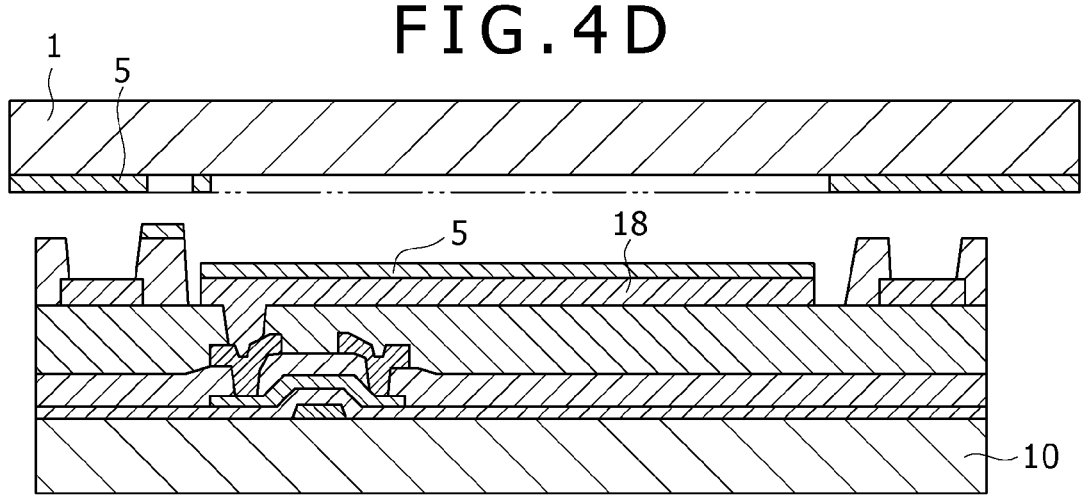

Referring next to FIG. 4D, the donor film 1 is separated from the substrate 10.

Thereafter, through repetition of the steps of FIGS. 4C to 4D, the organic layer 5 for each of the remaining colors is selectively formed on the lower electrodes 18 in pixels of a respective one of the colors.

Figure 4E:
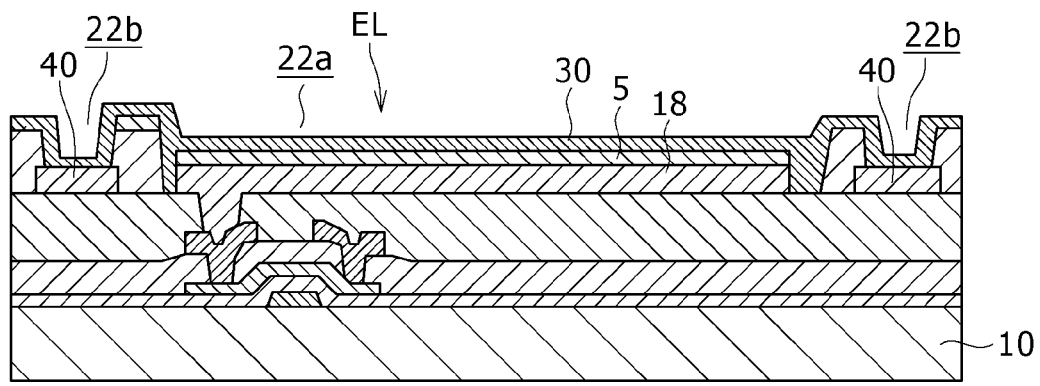

Subsequently, as shown in FIG. 4E, an upper electrode 30 common to the respective pixels is formed on the whole of the display area over the substrate 10. The upper electrode 30 is connected to the auxiliary electrode 40.

Figure 4F:
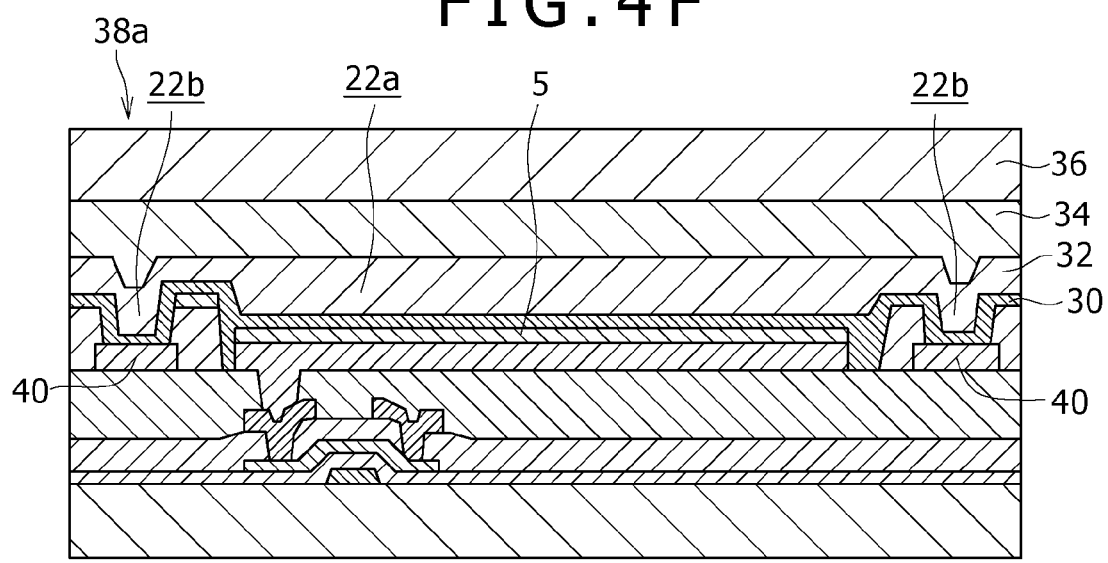

Thereafter, as shown in FIG. 4F, an insulating or conductive protective film 32 is provided on the upper electrode 30. Furthermore, a counter substrate 36 is fixed over the protective film 32 with a UV-curable resin 34 according to need, so that a display 38a is completed.

Third Embodiment

FIGS. 5A to 5F are sectional views for explaining steps of a manufacturing method that employs a donor film having the above-described one configuration example according to a third embodiment of the present invention. These sectional views of steps correspond to a section of one pixel in the display area. The same components in the third embodiment as those in the second embodiment are given the same numerals, and a redundant description thereof is omitted.

Figure 5A:
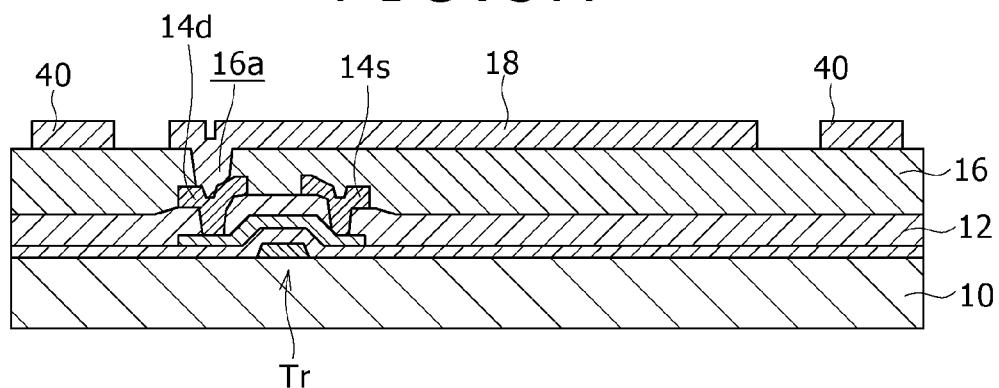
FIGS. 5A to 5F are sectional views showing steps of a manufacturing method according to a third embodiment of the present invention.

Referring initially to FIG. 5A, elements such as a thin film transistor Tr included in a pixel circuit are formed on a substrate 10, and these elements are covered by a first insulating film 12. On the first insulating film 12, a source electrode interconnect 14s and a drain electrode interconnect 14d that are connected to the thin film transistor Tr, and a signal line, power supply line, and so on that are connected to these interconnects 14s and 14d are adequately formed.

Subsequently, similarly to the second embodiment, a second insulating film 16 is formed on the first insulating film 12 and a connection hole 16a reaching the drain electrode interconnect 14d is provided, followed by formation of a lower electrode 18 of an organic EL element and an auxiliary electrode 40 on the planarization surface of the second insulating film 16.

Figure 5B:
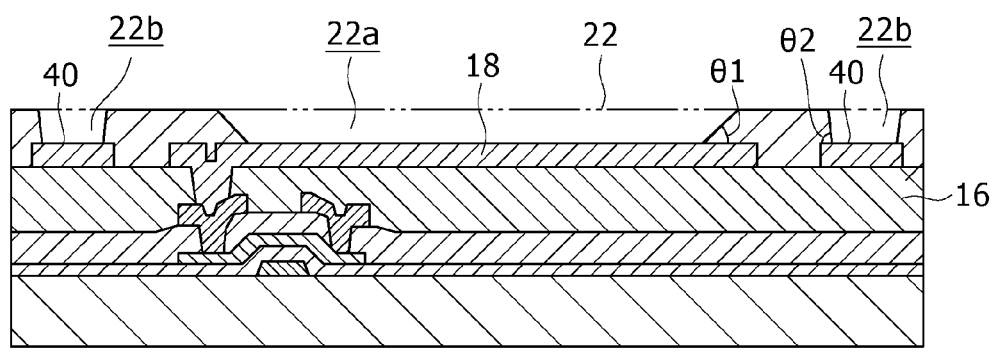

Referring next to FIG. 5B, a third insulating film 22 is formed in such a manner as to cover the lower electrode 18 and the auxiliary electrode 40. The third insulating film 22 is formed as a planarization insulating film composed of e.g. an organic insulating material such as polyimide or photoresist or an inorganic insulating material such as SOG.

Subsequently, in the third insulating film 22, a opening 22a that widely exposes the center part of the lower electrode 18 with the peripheral edge thereof covered, and a connection hole 22b reaching the auxiliary electrode 40 are formed. A feature of the third embodiment is that the opening 22a and the connection hole 22b are formed in order that the taper angle $\theta 1$ of the sidewall of the opening 22a (it is preferable that the taper angle $\theta 1$ be equal to or smaller than 30°) is smaller than the taper angle $\theta 2$ of the sidewall of the connection hole 22b.

The formation of such opening 22a and connection hole 22b is carried out through e.g. two times of etching with use of resist patterns. Specifically, on the third insulating film 22, a first resist pattern having an aperture corresponding to the opening 22a with the taper angle $\theta 1$ is formed. Subsequently, from above the first resist pattern, etching is performed for the third insulating film 22 and the first resist pattern, so that the opening 22a having the taper angle $\theta 1$ is formed in the third insulating film 22. Similarly, by etching with use of a second resist pattern, the connection hole 22b having the taper angle $\theta 2$ is formed in the third insulating film 22.

The taper angles of apertures provided in the first and second resist patterns can be adjusted based on the exposure amount and so on at the time of the resist formation.

After the above-described steps, the steps shown in FIGS. 5C to 5F are carried out similarly to the first embodiment.

Figure 5C:
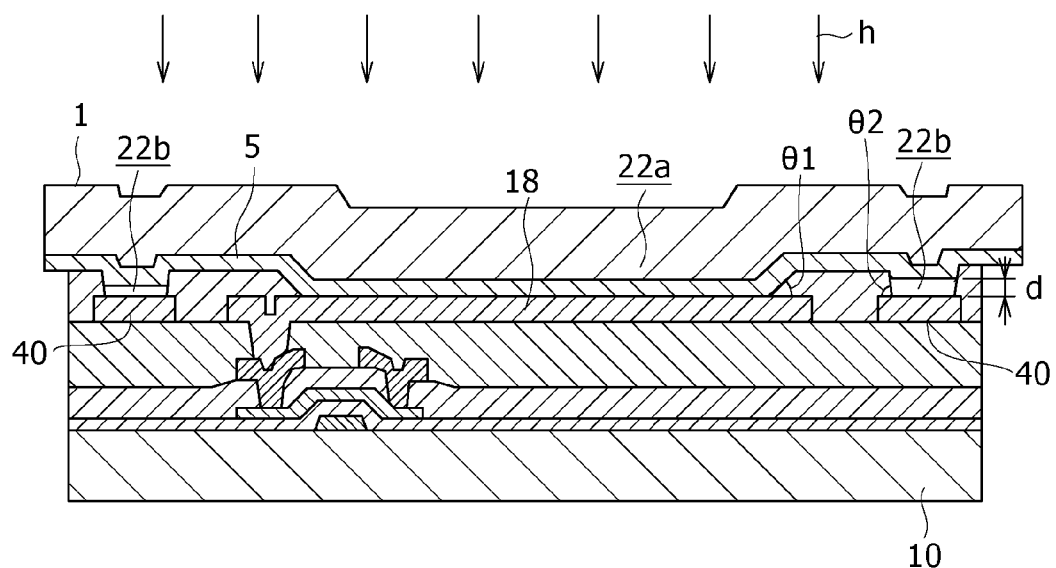

Referring initially to FIG. 5C, a donor film 1 is disposed on one surface side of the substrate 10 on which the lower electrode 18 is formed. Specifically, the organic layer side of the donor film 1 with the configuration described with FIG. 1 is brought into close contact with the lower electrode side of the substrate 10. At this time, a gap d is provided between the organic layer 5 and the auxiliary electrode 40 exposed at the bottom of the connection hole 22b, of which sidewall taper angle $\theta 2$ is larger than the sidewall taper angle $\theta 1$ of the opening 22a. On the other hand, the organic layer 5 is brought into close contact with the lower electrode 18 exposed at the bottom of the opening 22a, of which sidewall taper angle $\theta 1$ is smaller than the sidewall taper angle $\theta 2$ of the connection hole 22b.

In this state, from the donor film side, the part corresponding to the lower electrodes 18 of selected pixels is irradiated with an energy beam such as laser light h. Thereby, the organic layer 5 over the donor film 1 is selectively transferred onto the lower electrodes 18.

Figure 5D:
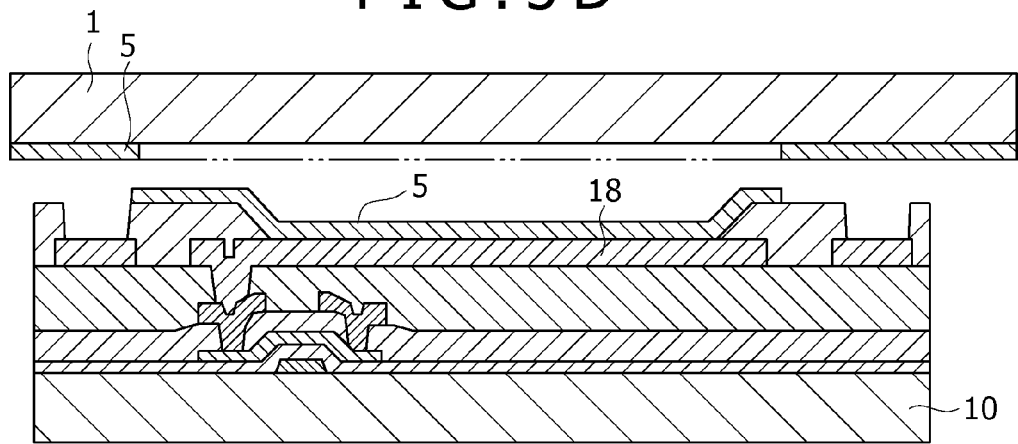

Subsequently, as shown in FIG. 5D, the donor film 1 is separated from the substrate 10.

Thereafter, through repetition of the steps of FIGS. 5C and 5D, the organic layer 5 for each of the remaining colors is selectively formed on the lower electrodes 18 formed in pixels of a respective one of the colors.

Figure 5E:
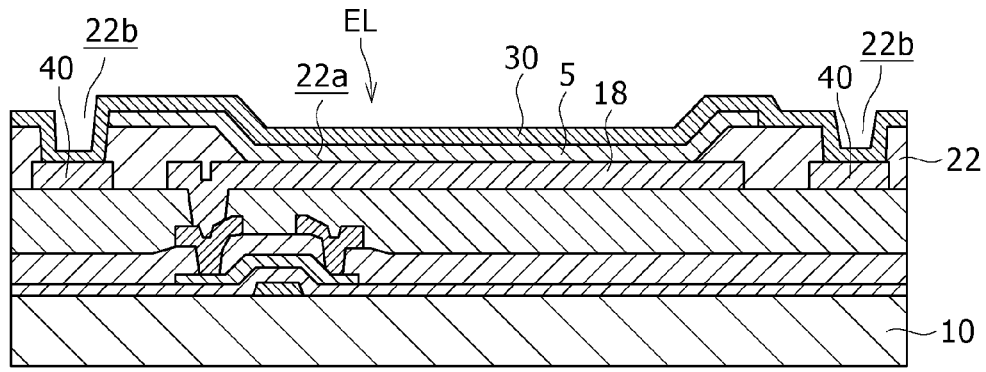

Subsequently, as shown in FIG. 5E, an upper electrode 30 common to the respective pixels is formed on the whole of the display area over the substrate 10. The upper electrode 30 is connected to the auxiliary electrode 40, which is exposed also after the transfer of the organic layer 5.

Through this formation of the upper electrode 30, the organic electro-luminescence elements EL in which the organic layer 5 is interposed between the lower electrode 18 and the upper electrode 30 are formed over the substrate 10, corresponding to the respective openings 22a. For the organic electro-luminescence elements EL, the upper electrode 30 is connected to the auxiliary electrode 40, which prevents a voltage drop.

Figure 5F:
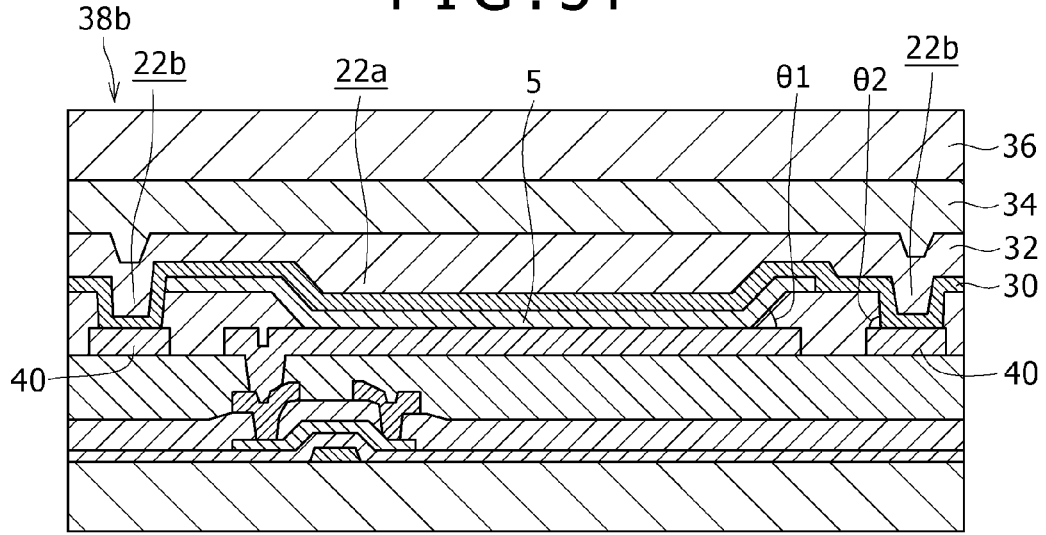

After the formation of the upper electrode 30, as shown in FIG. 5F, an insulating or conductive protective film 32 is provided on the upper electrode 30. Furthermore, a counter substrate 36 is fixed over the protective film 32 with a UV-curable resin 34 according to need, so that a display 38b is completed.

The above-described first, second and third embodiments can be adequately combined with each other, and the combining can enhance advantages of the embodiments.

Fourth Embodiment

FIGS. 6A to 6F are sectional views for explaining steps of a manufacturing method that employs a donor film having the above-described one configuration example according to a fourth embodiment of the present invention. These sectional views of steps correspond to a section of one pixel in the display area. The same components in the fourth embodiment as those in the first embodiment are given the same numerals, and a redundant description thereof is omitted.

Figure 6A:
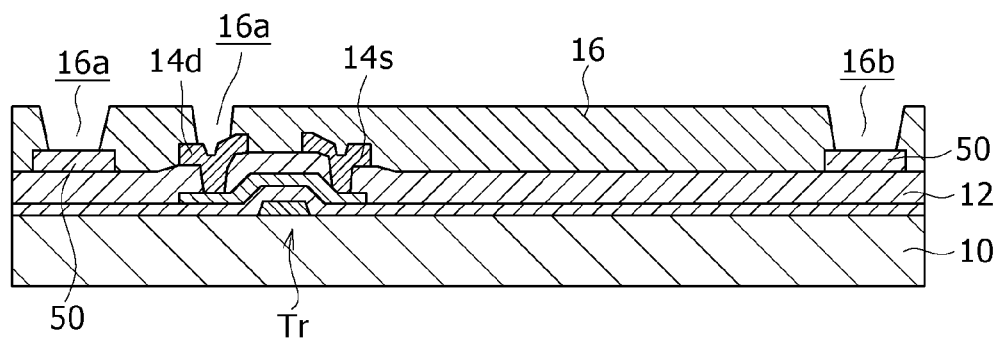
FIGS. 6A to 6F are sectional views showing steps of a manufacturing method according to a fourth embodiment of the present invention.

Referring initially to FIG. 6A, elements such as a thin film transistor Tr included in a pixel circuit are formed on a substrate 10, and these elements are covered by a first insulating film 12. On the first insulating film 12, a source electrode interconnect 14s and a drain electrode interconnect 14d that are connected to the thin film transistor Tr, and a signal line, power supply line, and so on that are connected to these interconnects 14s and 14d are adequately formed.

A feature of the fourth embodiment is that an auxiliary electrode 50 is formed by using the same layer as the layer of any of the above-described elements and interconnects. The auxiliary electrode 50 may be supplied with a common potential in the display area similarly to the first embodiment. As shown in the layout diagram of FIG. 3 for example, the auxiliary electrode 50 is provided on rows and columns among lower electrodes 18 to be formed in the next step. Although the drawing shows a structure in which the auxiliary electrode 50 is formed by using the same layer as the layer of the source electrode interconnect 14s and the drain electrode interconnect 14d, the auxiliary electrode 50 may be formed by using the same layer as the layer of another interconnect (not shown).

After the formation of the interconnects including the auxiliary electrode 50, a second insulating film 16 is formed on the first insulating film 12 in such a manner as to cover these interconnects. This second insulating film 16 may be formed as a planarization insulating film like that shown in the drawing, or alternatively may be formed to have a substantially uniform film thickness.

In the second insulating film 16, a connection hole 16a reaching the drain electrode interconnect 14d is formed. At this time, a connection hole 16b reaching the auxiliary electrode 50 is simultaneously formed.

Figure 6B:
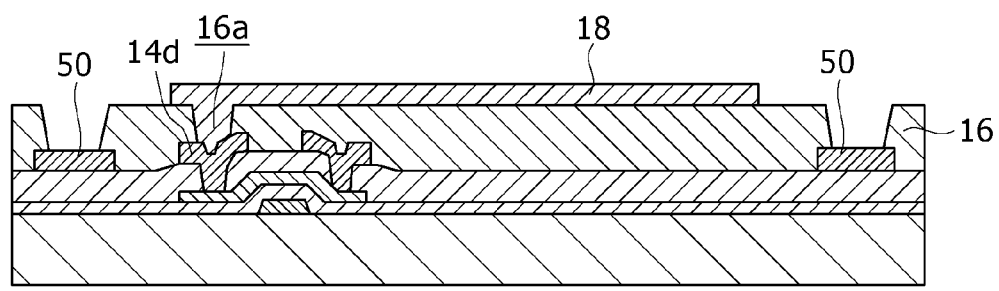

Referring next to FIG. 6B, on the second insulating film 16, the lower electrode 18 connected to the drain electrode interconnect 14d is formed in order that the lower electrodes 18 are arranged in a matrix in the display area. This allows the surface of the lower electrode 18 to be positioned higher than that of the auxiliary electrode 50. As shown in the layout diagram of FIG. 3, the lower electrodes 18 are disposed among the auxiliary electrode 50 provided on rows and columns.

After the above-described steps, the steps shown in FIGS. 6C to 6F are carried out similarly to the first embodiment.

Figure 6C:
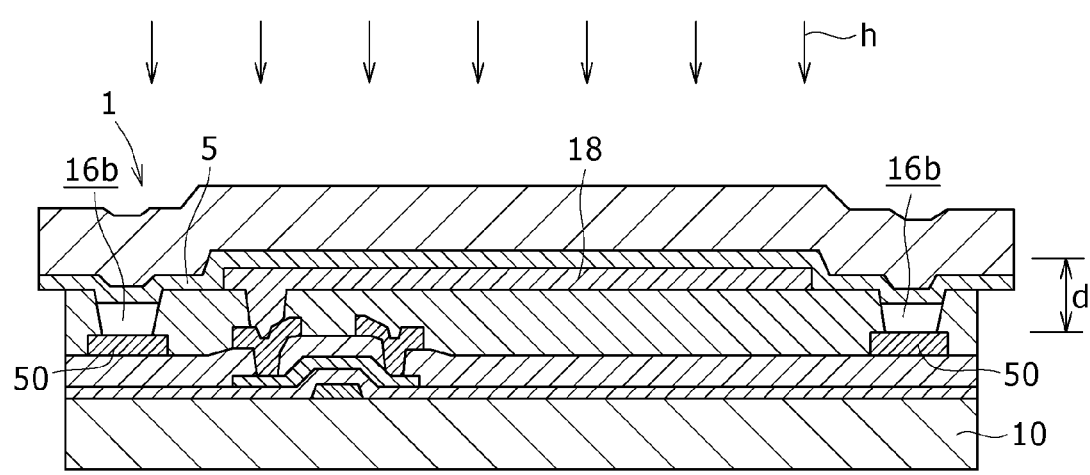

Specifically, referring initially to FIG. 6C, a donor film 1 is disposed on one surface side of the substrate 10 on which the lower electrode 18 is formed. Specifically, the organic layer side of the donor film 1 with the configuration described with FIG. 1 is brought into close contact with the lower electrode side of the substrate 10. At this time, a gap d is provided between the organic layer 5 and the auxiliary electrode 50 exposed at the bottom of the connection hole 16b. On the other hand, the organic layer 5 is brought into close contact with the lower electrode 18 formed on the surface of the second insulating film 16.

In this state, from the donor film side, the part corresponding to the lower electrodes 18 of selected pixels is irradiated with an energy beam such as laser light h. Thereby, the organic layer 5 over the donor film 1 is selectively transferred onto the lower electrodes 18.

Figure 6D:
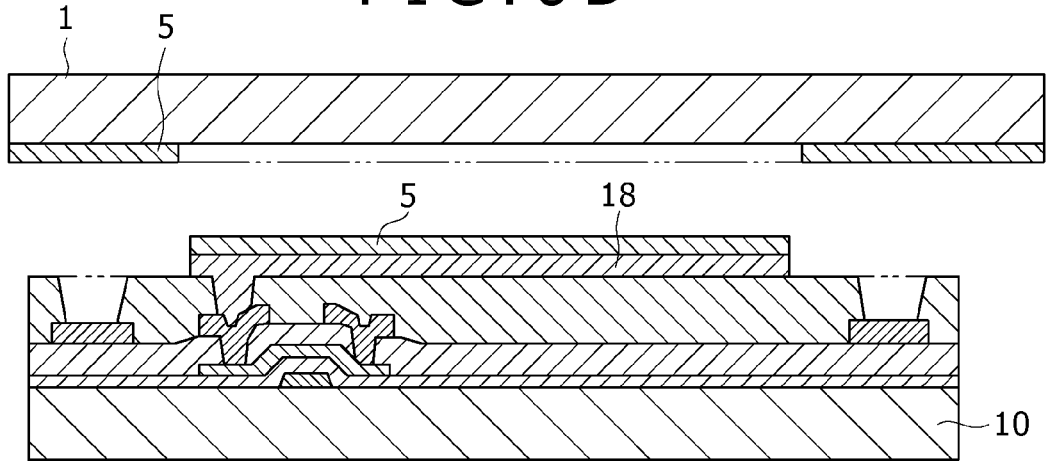

Referring next to FIG. 6D, the donor film 1 is separated from the substrate 10.

Thereafter, through repetition of the steps of FIGS. 6C and 6D, the organic layer 5 for each of the remaining colors is selectively formed on the lower electrodes 18 formed in pixels of a respective one of the colors.

Figure 6E:
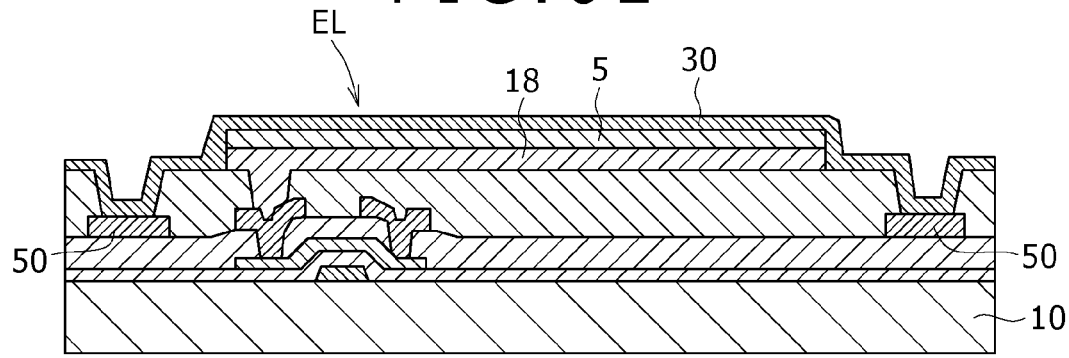

Subsequently, as shown in FIG. 6E, an upper electrode 30 common to the respective pixels is formed on the whole of the display area over the substrate 10. The upper electrode 30 is connected to the auxiliary electrode 50.

Figure 6F:
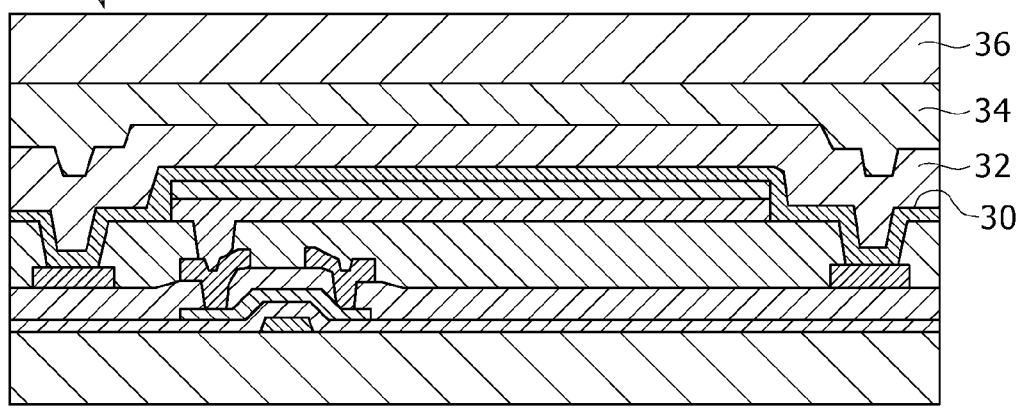

Thereafter, as shown in FIG. 6F, an insulating or conductive protective film 32 is provided on the upper electrode 30. Furthermore, a counter substrate 36 is fixed over the protective film 32 with a UV-curable resin 34 according to need, so that a display 52 is completed.

The fourth embodiment can be combined with the first embodiment, and the combining can enhance advantages of the embodiments.

Fifth Embodiment

FIGS. 7A to 7F are sectional views for explaining steps of a manufacturing method that employs a donor film having the above-described one configuration example according to a fifth embodiment of the present invention. These sectional views of steps correspond to a section of one pixel in the display area. The same components in the fifth embodiment as those in the first embodiment are given the same numerals, and a redundant description thereof is omitted.

Figure 7A:
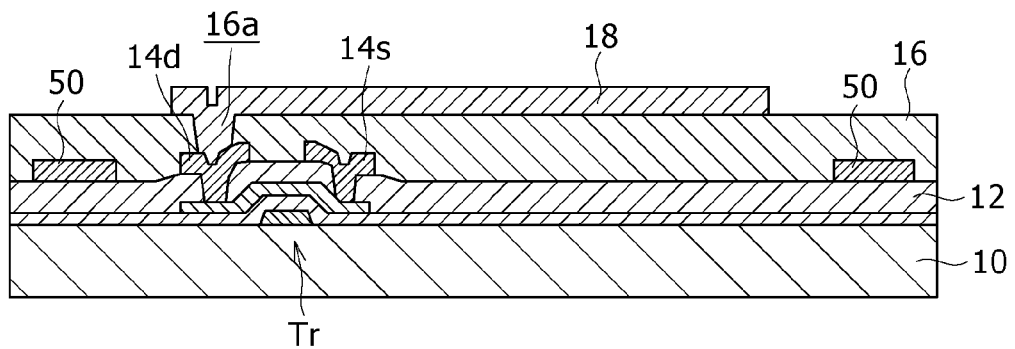
FIGS. 7A to 7F are sectional views showing steps of a manufacturing method according to a fifth embodiment of the present invention.

Referring initially to FIG. 7A, elements such as a thin film transistor Tr included in a pixel circuit are formed on a substrate 10, and these elements are covered by a first insulating film 12. On the first insulating film 12, a source electrode interconnect 14s and a drain electrode interconnect 14d that are connected to the thin film transistor Tr, and a signal line, power supply line, and so on that are connected to these interconnects 14s and 14d are adequately formed.

Similarly to the fourth embodiment, a feature of the fifth embodiment is also that an auxiliary electrode 50 is formed by using the same layer as the layer of any of the above-described elements and interconnects.

After the formation of the interconnects including the auxiliary electrode 50, a second insulating film 16 is formed on the first insulating film 12 in such a manner as to cover these interconnects. Furthermore, a connection hole 16a reaching the drain electrode interconnect 14d is formed. This second insulating film 16 may be formed as a planarization insulating film like that shown in the drawing, or alternatively may be formed to have a substantially uniform film thickness.

After the connection hole 16a reaching the drain electrode interconnect 14d is provided in the second insulating film 16, the lower electrodes 18 each connected to the drain electrode interconnect 14d are so formed on the second insulating film 16 as to be arranged in a matrix in the display area. This allows the surface of the lower electrode 18 to be positioned higher than that of the auxiliary electrode 50. As shown in the layout diagram of FIG. 3, the lower electrodes 18 are disposed among the auxiliary electrode 50 provided on rows and columns.

Figure 7B:
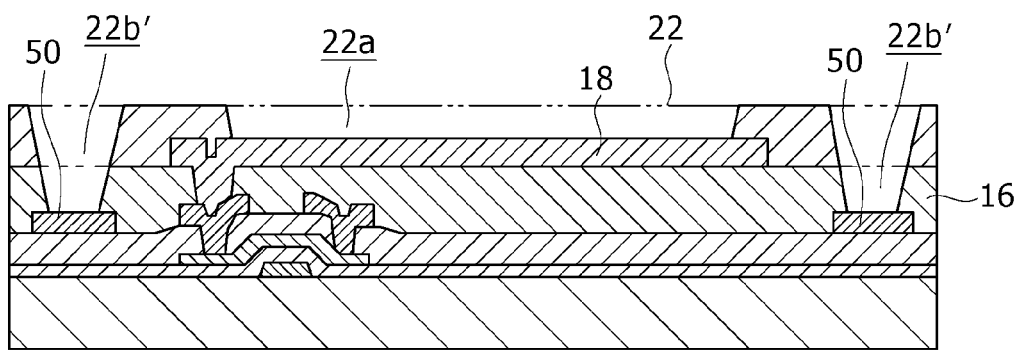

Referring next to FIG. 7B, a third insulating film 22 is formed in such a manner as to cover the lower electrode 18. This third insulating film 22 may be formed as a planarization insulating film like that shown in the drawing, or alternatively may be formed to have a substantially uniform film thickness. Through the above-described steps, the lower electrode 18 is covered by the third insulating film 22, while the auxiliary electrode 50 is covered by the second insulating film 16 and the third insulating film 22. Thus, the film thickness of the insulating layer on the auxiliary electrode 50 is larger than that on the lower electrode 18.

Subsequently, in the third insulating film 22, a opening 22a that widely exposes the center part of the lower electrode 18 with the peripheral edge thereof covered is formed. Furthermore, a connection hole 22b' reaching the auxiliary electrode 50 is formed in the third insulating film 22 and the second insulating film 16. Thus, the depth of the connection hole 22b' on the auxiliary electrode 50 is larger than that of the opening 22a on the lower electrode 18. In the aperture formation step, it is preferable to carry out etching of which condition is so set that the taper angle of the sidewall of the opening 22a will be set to 30° or smaller.

After the above-described steps, the steps shown in FIGS. 7C to 7F are carried out similarly to the first embodiment.

Figure 7C:
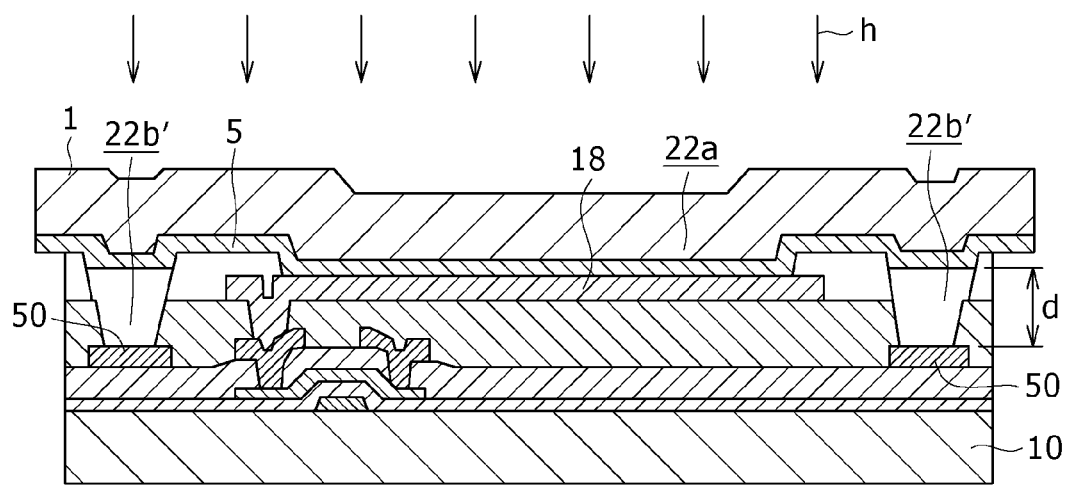

Referring initially to FIG. 7C, a donor film 1 is disposed on one surface side of the substrate 10 on which the lower electrode 18 is formed. The organic layer 5 over the donor film 1 is brought into close contact with the lower electrode 18 over the substrate 10. At this time, a gap d is provided between the organic layer 5 and the auxiliary electrode 50 exposed at the bottom of the connection hole 22b', which is deeper than the opening 22a. On the other hand, the organic layer 5 is brought into close contact with the lower electrode 18 exposed at the bottom of the opening 22a, which is shallower than the connection hole 22b'.

In this state, an energy beam such as laser light h is emitted from the donor film side. Thereby, the organic layer 5 over the donor film 1 is selectively transferred onto the lower electrode 18.

Figure 7D:
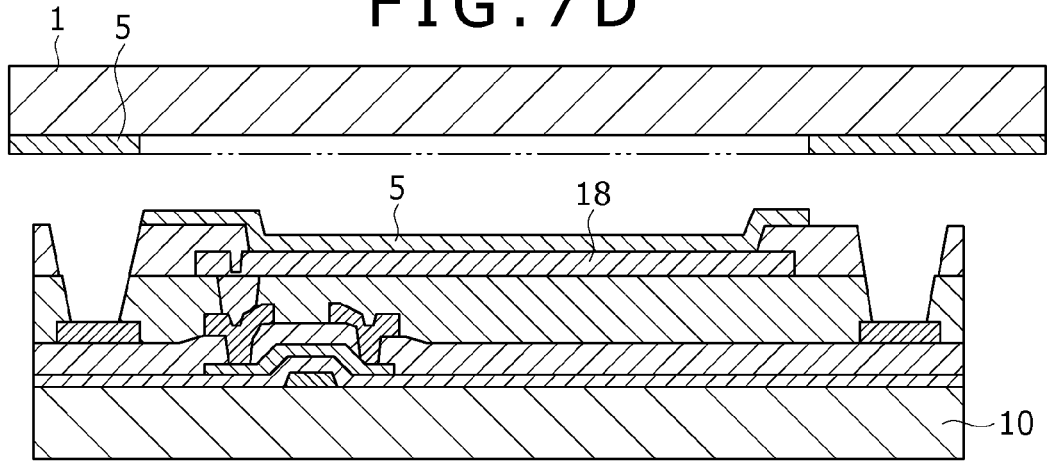

Referring next to FIG. 7D, the donor film 1 is separated from the substrate 10.

Thereafter, through repetition of the steps of FIGS. 7C and 7D, the organic layer 5 for each of the remaining colors is selectively formed on the lower electrodes 18 formed in pixels of a respective one of the colors.

Figure 7E:
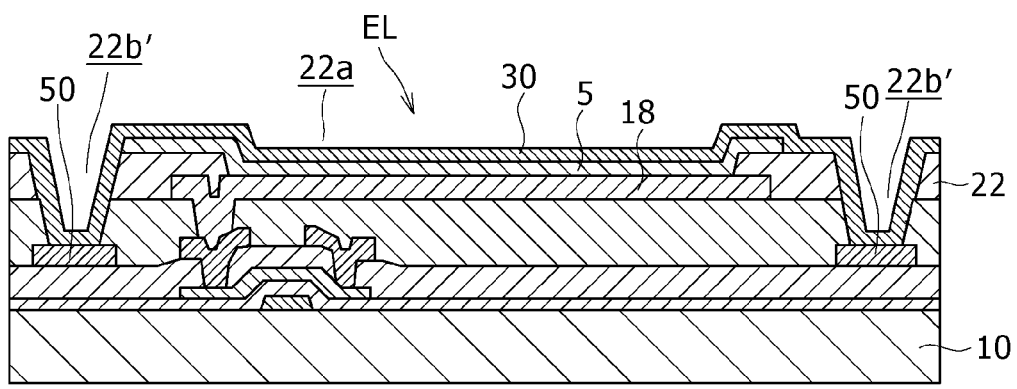

Subsequently, as shown in FIG. 7E, an upper electrode 30 common to the respective pixels is formed on the whole of the display area over the substrate 10. The upper electrode 30 is connected to the auxiliary electrode 50.

Figure 7F:
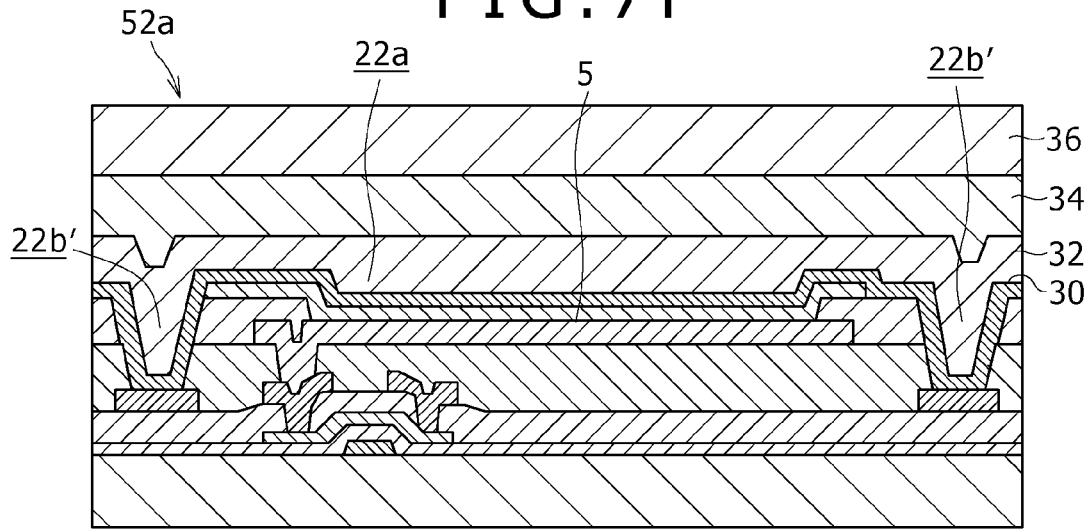

Thereafter, as shown in FIG. 7F, an insulating or conductive protective film 32 is provided on the upper electrode 30. Furthermore, a counter substrate 36 is fixed over the protective film 32 with a UV-curable resin 34 according to need, so that a display 52a is completed.

The fifth embodiment can be combined with the first to third embodiments, and the combining can enhance advantages of the embodiments.

According to the above-described first to fifth embodiments, in a contact transfer step, irradiation with the laser light h is carried out in the state in which the donor film 1 is brought into close contact with the lower electrode 18 while a gap d is provided between the auxiliary electrode and the donor film 1. Therefore, even when a positional error of the area irradiated with the laser light h occurs, the organic layer 5 is not transferred onto the auxiliary electrode.

Consequently, enhancements in the luminance and lifetime of the organic electro-luminescence elements EL can be achieved, and thus the displaying performance of the display can be improved.

Modification Example

Figure 8A:
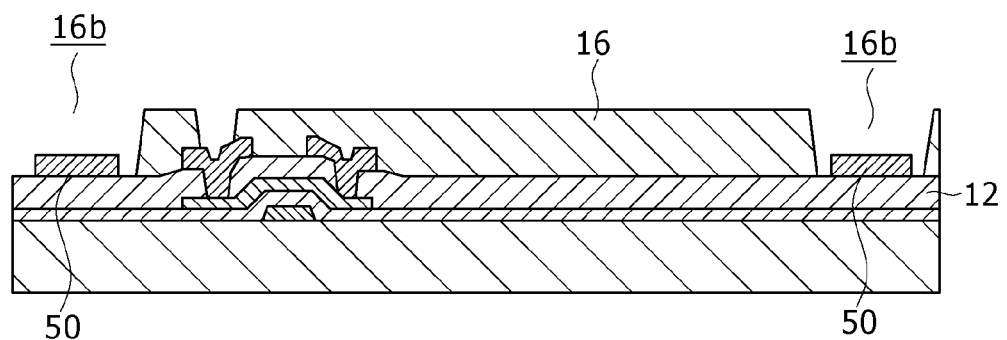
FIGS. 8A to 8C are sectional views showing steps of a modification example of an embodiment of the present invention.

As one of modification examples of the above-described first to fifth embodiments, a modification example of the fourth embodiment is shown in FIG. 8. As shown in FIG. 8A, a connection hole 16b in a second insulating film 16 that covers an auxiliary electrode 50 may be formed in order that the sidewall of the auxiliary electrode 50 is exposed. In this feature, this modification example is different from the above-described first to fifth embodiments.

Figure 8B:
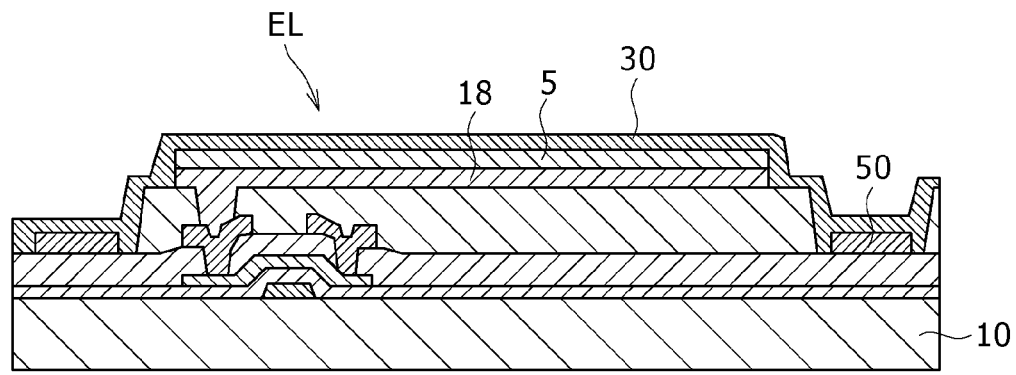
Figure 8C:
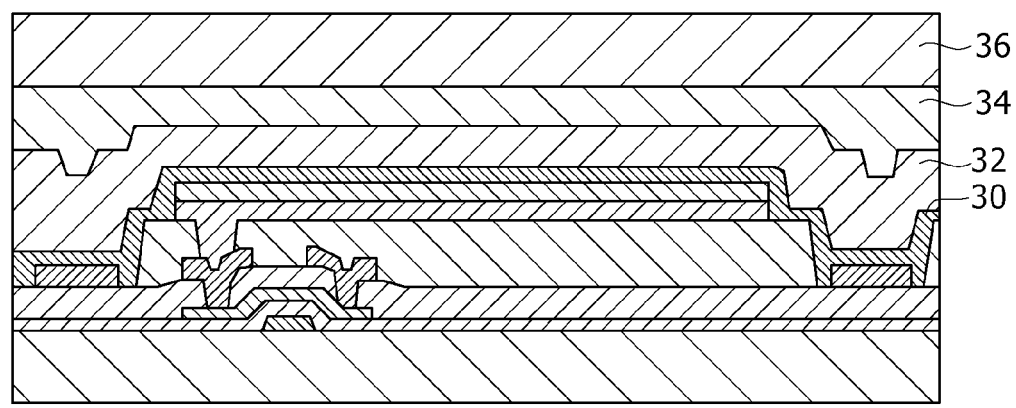

After the formation of such a connection hole 16b, a procedure similar to that of the fourth embodiment is carried out, so that an organic electro-luminescence element EL is formed as shown in FIG. 8B. Thereafter, as shown in FIG. 8C, a counter substrate 36 is fixed with a protective film 32 and a UV-curable resin 34, so that a display 52b is completed.

Such a structure can also achieve the same advantages as those of the fourth embodiment.

The concept of this modification example can be applied to the first to third embodiments and the fifth embodiment as well as to the fourth embodiment. Furthermore, in a configuration in which the opening 22a is provided like those shown in the first to third embodiments and the fifth embodiment, the entire face of the lower electrode may be exposed via the opening 22a as long as the lower electrode is isolated from the upper electrode by the organic layer formed on the lower electrode through transfer.

The above-described respective embodiments (including also the modification example) relate to a procedure of manufacturing of an active-matrix display. However, embodiments of the present invention can be applied also to manufacturing of a passive-matrix display in a similar manner, and can achieve the same advantages.

Figure 9:
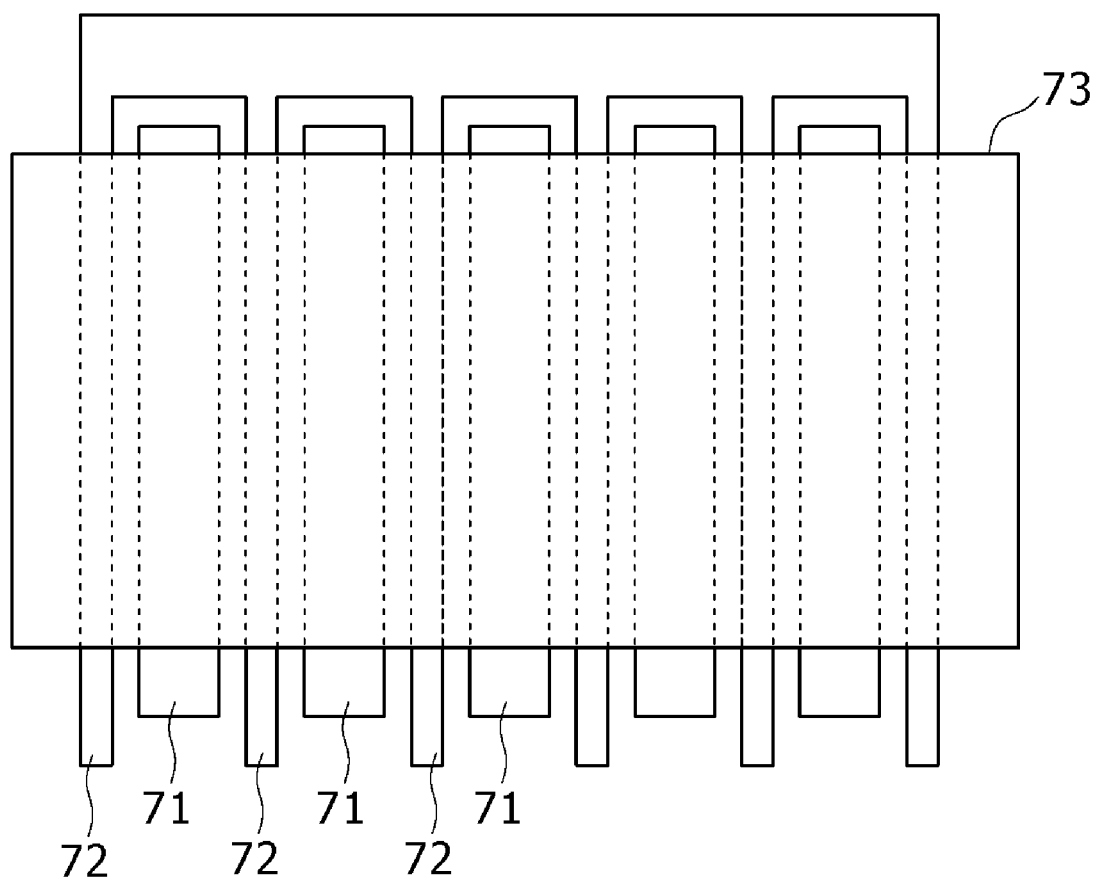
FIG. 9 is a plan view showing one example of the layout of lower electrodes, an auxiliary electrode, and an upper electrode in a passive-matrix display.

In a passive-matrix display, as shown in the layout diagram of FIG. 9, lower electrodes 71 are formed to extend in one direction, and an auxiliary electrode 72 is provided among these lower electrodes 71. This auxiliary electrode 72 is provided as a common electrode. Furthermore, an upper electrode 73 as a common electrode is provided over the lower electrodes 71 and the auxiliary electrode 72. Similarly to an active-matrix display, organic EL elements are formed by interposing an organic layer (not shown) between the lower electrodes 71 and the upper electrode 73 that intersect and overlap with each other. In addition, similarly to an active-matrix display, at the parts where the upper electrode 73 overlaps over the auxiliary electrode 72, the upper electrode 73 is connected to the auxiliary electrode 72 via a connection hole.

In manufacturing of a passive-matrix display having such a configuration, by applying any of the above-described embodiments to steps for forming the lower electrodes 71 and the auxiliary electrode 72 and forming the upper electrode 73 to form organic EL elements, the same advantages as those of the embodiments can be achieved.

The above-described embodiments are not limited to application to a display employing organic EL elements. The embodiments can be widely applied to formation of a light-emitting functional layer by a contact transfer method in manufacturing of a display that includes light-emitting elements obtained by interposing the light-emitting functional layer between an upper electrode and a lower electrode, and has an auxiliary electrode connected to the upper electrode, and the embodiments can achieve the same advantages.

It should be understood by those skilled in the art that various modifications, combinations, sub-combinations and alterations may occur depending on design requirements and other factor in so far as they are within the scope of the appended claims or the equivalents thereof.

What is claimed is:

1. A method for manufacturing a display, the method comprising the steps of:
    forming a plurality of lower electrodes and a plurality of auxiliary electrodes over a substrate such that a film thickness of an auxiliary electrode is less than a film thickness of a lower electrode;
    forming an insulating film over the substrate so that the lower electrodes and the auxiliary electrodes are covered by the insulating film, and forming, in the insulating film, openings that expose the lower electrodes and connection holes that expose the auxiliary electrodes;
    disposing the substrate and a donor film over which a light-emitting functional layer is formed so that the light-emitting functional layer contacts with the lower electrodes and does not contact with the auxiliary electrodes;
    irradiating the donor film with an energy beam to selectively transfer the light-emitting functional layer onto the lower electrodes; and
    forming an upper electrode that covers the light-emitting functional layer and the connection holes,
    wherein,
        the plurality of lower electrodes and the plurality of auxiliary electrodes are in contact with a common planarized surface such that a height of the lower electrodes on the common planarized surface is higher than a height of the auxiliary electrodes on the common planarized surface.

2. The method for manufacturing the display according to claim 1, wherein a film thickness of the insulating film on the auxiliary electrodes is larger than a film thickness of the insulating film on the lower electrodes.

3. The method for manufacturing the display according to claim 1, wherein a taper angle of sidewalls of the connection holes is larger than a taper angle of sidewalls of the openings.

4. The method for manufacturing the display according to claim 3, wherein the taper angle of the sidewalls of the opening is equal to or less than 30 degrees.

5. The method for manufacturing the display according to claim 1, wherein the insulating film has a flat surface.

6. The method for manufacturing the display according to claim 1, wherein the plurality of lower electrodes and the plurality of auxiliary electrodes are formed to satisfy the following relation:

$$t2 \geq t1 + 500 \text{ nm},$$

wherein $t1$ is the film thickness of the plurality of auxiliary electrodes, and $t2$ is the film thickness of the plurality of lower electrodes.

7. A method for manufacturing a display, the method comprising the steps of:
    forming a plurality of lower electrodes and a plurality of auxiliary electrodes over a substrate such that a film thickness of an auxiliary electrode is less than a film thickness of a lower electrode;
    forming an insulating film over the substrate so that the lower electrodes and the auxiliary electrodes are covered by the insulating film, and forming, in the insulating film, openings that expose the lower electrodes and connection holes that expose the auxiliary electrodes;
    patterning the plurality of lower electrodes and the plurality of auxiliary electrodes in the same process step;
    etching only the plurality of auxiliary electrodes to reduce a film thickness of the plurality of auxiliary electrodes;
    disposing the substrate and a donor film over which a light-emitting functional layer is formed so that the light-emitting functional layer contacts with the lower electrodes and does not contact with the auxiliary electrodes;
    irradiating the donor film with an energy beam to selectively transfer the light-emitting functional layer onto the lower electrodes; and
    forming an upper electrode that covers the light-emitting functional layer and the connection holes.

* * * * *